United States Patent [19]

Royse

[11] Patent Number: 4,743,380

[45] Date of Patent: May 10, 1988

[54] SOLVENT RECOVERY SYSTEM

[75] Inventor: Edwin H. Royse, Dallas, Tex.

[73] Assignee: Royse Manufacturing Company, Inc., Dallas, Tex.

[21] Appl. No.: 57,494

[22] Filed: Jun. 3, 1987

[51] Int. Cl.$^4$ .............................................. B01D 21/00
[52] U.S. Cl. ..................................... 210/737; 210/774
[58] Field of Search ............... 210/737, 774, 722, 758, 210/670, 673; 62/123

[56] References Cited

U.S. PATENT DOCUMENTS

| | | | |
|---|---|---|---|
| 3,931,004 | 1/1976 | Shmamura, et al. ................ | 210/670 |
| 4,135,976 | 1/1979 | Kitajima .............................. | 210/758 |
| 4,163,023 | 7/1979 | Endo et al. .......................... | 210/673 |
| 4,321,149 | 3/1982 | Kauxhurst et al. ................. | 210/722 |

Primary Examiner—Frank Sever
Attorney, Agent, or Firm—Richards, Harris, Medlock & Andrews

[57] ABSTRACT

A solvent recovery system (10) is disclosed which separates material from a solution by refrigeration. The solution is used to wash a printing plate and the material is washed from the plate by the solution. The contaminated solution is refrigerated within a disposable container (32) to separate the material from a solution. The purified solution is then drawn off from the container, leaving the material as residue for disposal in the container.

4 Claims, 1 Drawing Sheet

SOLVENT RECOVERY SYSTEM

TECHNICAL FIELD

This invention relates to the flexographic printing industry, and in particular to the process for developing print plates.

BACKGROUND OF THE INVENTION

As one step in the flexographic printing process, printing plates are developed. During the development process, the plates are washed by a solution of solvents, typically comprising about 95% perchloroethylene (tetrachloroethylene) and about 5% butyl alcohol, although these proportions can vary for a particular application. The solvents are used in wash away areas of a polymer artificial rubber printing plate so that the desired pattern to be printed remains. The dissolved printing plate material, a polymer, goes into the solution. The washed plate is then heated in an oven in the next stage of processing.

The cleaning process requires a relatively pure solvent solution. However, the dissolved polymer material from the printing plate that is washed off by the solvent builds up in concentration in the solution, eventually contaminating the solution. As the concentration of material increases, the plates become tacky and require hand cleaning, a time consuming task. Also, the dissolved material will come out of solution and build on the surfaces in the solvent flow path.

Because of the build up on this material, the solvent must be replaced relatively frequently. Because the dissolved polymer has been classified as a hazardous material, the used solution can not be readily disposed of. Typically, the user will either pay a service to take the used solution and separate the solution and the dissolved polymer material by a distillation process or buy the expensive distillation equipment to distill the solution on site. while the distillation process separates the polymer material from the solution, it also disturbs the balance of chemicals. Thus, the concentration of perchloroethylene and alcohol must be measured after distillation, and a suitable quantity of the proper chemical added to rebalance the solution. Because of the inconvenience and expense related to this process, a need exists for a better technique to separate dissolved materials, such as polymers, from the solution without altering the solution itself.

SUMMARY OF THE INVENTION

In accordance with one aspect of the present invention, a process is provided for separating dissolved materials from a solution for use in a flexographic plate producing process. The process includes the steps of refrigerating the solution in a container to separate the material and solution and subsequently drawing the purified solution from the container, leaving the material in the container as residue.

In accordance with another aspect of the present invention, the dissolved materials are dissolved polymers washed from printing plates and the solution comprises perchloroethylene and butyl alcohol.

In accordance with another aspect of the present invention, an apparatus is provided for separating dissolved materials from a solution for use in a flexographic plate producing process. The apparatus includes a container for holding the solution to be purified. The apparatus further includes refrigeration structure for refrigerating the container to cause separation of the material from the solution and structure to draw the purified solution from the container, leaving the material as residue for disposal in the container.

DESCRIPTION OF THE DRAWINGS

For a more complete understanding of the present invention and the advantages thereof, reference is now made to the following description taken in conjunction with the accompanying drawing, in which.

DETAILED DESCRIPTION

Figure 1:
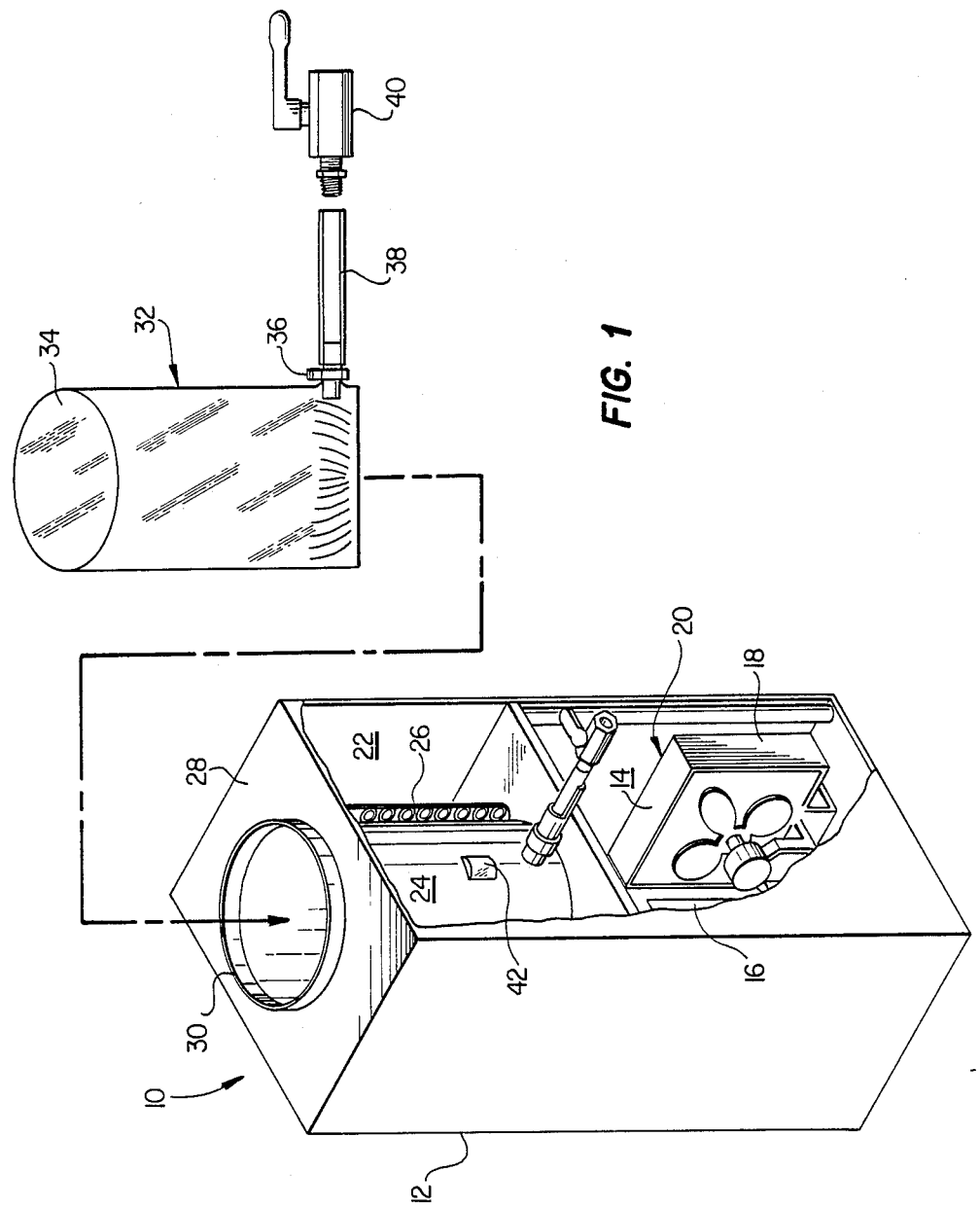
FIG. 1 is a perspective view of an apparatus forming a first embodiment of the present invention.

The present invention provides a novel process for separating dissolved materials from a solvent by refrigeration in systems where the dissolved material solubility is a strong function of temperature and a reasonable difference in density exists between the solvents and the solute material. This process isolates the separated materials from the solution in a disposable container which is of great advantage when the material has obnoxious properties, such as stickiness, odor or is hazardous. While the process and apparatus has general application, a specific use is the separation of dissolved polymer materials from solvents used in the lithographic printing industry to develop printing plates. In this application, the process and apparatus provides separation overnight, facilitating reuse of the expensive solvent solution with no loss in performance.

As part of the etching process to produce printing plates from a polymer based artificial rubber material, one stage requires the plate to be washed with a relatively pure solution of perchloroethylene and butyl alcohol, with the alcohol typically in the range of 5 to 20% (usually 5%) by volume of the solution at room temperature. This solution dissolves untreated portions of the plate and carries them away in solution. By washing away certain areas of the plate, and not others, a design can be formed on the plate. Subsequent to solution washing, the plate is heated in an oven in the next stage of production.

The solution is normally kept in a supply tank and is pumped from the tank to spray nozzles to wash over the plate. After washing, the solution is collected in a drain for return to the storage tank. As can be readily understood, the concentration of polymer materials builds up in the solution. When the concentration becomes too high, the solution will no longer properly clean the plate to a degree sufficient for the next stage of the plate process, heating in the oven.

With reference now to FIG. 1, a solvent recovery system 10 is illustrated which can be used with a plate washing apparatus to purify the solution overnight so that the operator has a purified solution to use during processing the next day. The system 10 includes an enclosure 12 with a lower compartment 14 containing a refrigeration compressor 16 and condenser 18 forming part of a refrigeration device 20. An upper compartment 22 contains a cylinder 24 surrounded on its outer circumference by a refrigeration coil 26, also forming part of refrigeration device 20. The cylinder 24 extends upward through a top 28 of the upper compartment to form a cylindrical lip 30.

A disposable container 32 is placed within the cylinder 24 with the open upper end 34 of the container folded over the cylindrical lip 30 to hold the container in place. The container is formed of a material resistant to chemical attack by the solution, and is preferably formed of polyethylene having a thickness of about 3 mils when the solution is perchloroethylene and butyl alcohol. A hole is formed in the lower end of the container 32 which receives a compression fitting 36 which forms a fluid tight seal with the container. A nipple 38 extends from fitting 36 to a on/off valve 40. A lid (not shown) can be used to cover top 28, lip 30 and container 32 to prevent fumes from escaping from system 10 during the cleaning process.

The system 10 will normally not be used during the day, when a number of plates may be washed by the plate washing apparatus with the solution pumped from the storage tank to the plates and recovered back to the storage tank. However, at the end of the day, valving will be operated so that the output of the pump from the supply tank is directed into the open end 34 of the container, rather than to the spray nozzles to wash the plates. Preferably, the cylinder 24 and container 32 are sized to accept about 10 gallons of solution with a solution height of about 20 inches. The operator then activates system 10 to run the refrigeration device 20 and cool coils 26. As coils 26 are cooled, the cylinder 24, container 32, and solution within the container are cooled as well. Preferably, a sensor 42 is provided to shut down the refrigeration device 20 when a predetermined temperature is achieved in the solution, preferably in the range from 0 degrees F. to 20 degrees F. This cooling cycle will take only a very short time, less than 1 hour, as the perchloroethylene has a specific heat of 0.2 BTU per pound degrees F. The upper compartment 22 is sufficiently insulated so that the temperature will only slowly rise throughout the night (about 6-12 hours) in the solution and should reach plate processing temperature (50 degrees F. or above) by the opening of business hours the following morning.

It has been found that the dissolved polymer material and the solution of perchloroethylene and butyl alcohol separate when the solution is refrigerated. The solubility of the dissolved polymer material is a strong function of temperature and its separation is greatly accelerated by refrigeration. The solution of perchloroethylene and butyl alcohol has a specific gravity of about 1.586 with a density of about 13.228 lbs per gallon for a 5% butyl alcohol content. As separation occurs during refrigeration, the perchloroethylene and butyl alcohol will separate toward the bottom of the container 32, while the polymer material will collect at the upper part of the container.

By cooling the solution to 20 degrees F. and slowly allowing the temperature to rise overnight, the material content in the purified solution is 1% or less, an acceptable purity for reuse of the solution. Cooling the solution to about 0 degrees F. provides even greater purity; significantly less than 1% material content. These purity valves have been determined by measuring the relative volumes of separated material and solution in the test process, and then placing the container in a deep freeze (0 degrees F.) for several days until the solution is essentially pure, and measuring the change in relative volumes. Another advantage of the process is that once separated by refrigeration, the material and solution will remain separated in container 32 indefinitely at room temperature, and can thus be stored in the container until the purified solution is needed.

By morning, the closed valve 40 can be opened by the operator to permit the purified solution to drain from the lower part of container 32 back into the supply tank of the washing apparatus. The operator will observe the clarity of the solution and shut off valve 40 when the separated layer of material floating atop the purified solution begins to enter the nipple 38.

The container 32 can be reused until the container no longer can hold the collected residue and the 10 gallons of solution to be purified overnight. Periodically the container 32 can be emptied of residue, or the container 32 itself can be disposed of properly as the residue therein is considered a hazardous material.

The present invention provides significant advantages over the state of the art. The invention provides for purification of the solution on site, eliminating the need to pay an outside source to take contaminated solution, distill it and buy the purified distillate back or to buy expensive distillation equipment for in-house use. Further, the distillation forces the operator to undertake a time consuming task of remixing the solution with the proper percentages. By refrigerating the solution to a desired set point temperature and allowing the solution to slowly return to room temperature by the following morning, the maximum separation is achieved through refrigeration, while providing essentially room temperature purified solution which can be delivered directly to the supply tank for use in washing the plate. Also, because a distillation process requires vaporization of the solution, and the present process requires only refrigeration of the solution while remaining in the liquid phase, significant energy savings are achieved in the present process.

Although a single embodiment of the invention has been illustrated in the accompanying drawing and described in the foregoing Detailed Description, it will be understood that the invention is not limited to the embodiment disclosed, but is capable of numerous rearrangements, modifications and substitutions of parts and elements without departing from the scope and spirit of the invention.

I claim:

1. A process comprising separating dissolved material from a solution for use in a flexographic plate producing process, by,
    refrigerating the solution in a container to separate the material and solution;
    drawing the purified solution from the container, leaving the material in the container as residue.

2. The process of claim 1 wherein the solution is perchloroethylene and butyl alcohol and the material is polymer washed from a printing plate by the solution.

3. The process of claim 1 wherein the step of refrigerating the solution in a container comprises the steps of cooling the solution to about 20 degrees F. and insulating the container so that the solution temperature rises overnight to about 50 degrees F.

4. The process of claim 1 wherein the container is formed of polyethylene and collects the residue over sequential purification processes for eventual disposal.

* * * * *